United States Patent [19]

Yoda

[11] Patent Number: 4,924,184
[45] Date of Patent: May 8, 1990

[54] MAGNETIC RESONANCE APPARATUS

[75] Inventor: Kiyoshi Yoda, Amagasaki, Japan

[73] Assignee: Mitsubishi Denki Kabushiki Kaisha, Tokyo, Japan

[21] Appl. No.: 312,149

[22] Filed: Feb. 21, 1989

[30] Foreign Application Priority Data

Apr. 11, 1988 [JP] Japan .................................. 63-87292

[51] Int. Cl.$^5$ ........................................... G01R 33/20
[52] U.S. Cl. .................................................... 324/318
[58] Field of Search ........................ 324/318, 329, 322

[56] References Cited

U.S. PATENT DOCUMENTS

| 4,642,569 | 2/1987 | Hayes et al. | 324/318 |
| 4,686,473 | 8/1987 | Chesneau et al. | 324/320 |
| 4,785,246 | 11/1988 | Sugimoto | 324/322 |

FOREIGN PATENT DOCUMENTS

| 0045549 | 2/1988 | Japan | 324/318 |
| 8500138 | 8/1986 | Netherlands | 324/318 |

Primary Examiner—Hezron E. Williams
Assistant Examiner—Kevin D. O'Shea
Attorney, Agent, or Firm—Sughrue, Mion, Zinn, Macpeak & Seas

[57] ABSTRACT

A magnetic resonance apparatus comprising a magnet for generating a stationary magnetic field, a magnetic field gradient coil for generating gradient magnetic field pulses, and a radio frequency coil disposed within the magnet and the magnetic field gradient coil for transmitting radio frequency pulses and receiving a magnetic resonance signal. A radio frequency shield member is also disposed between the magnetic field gradient coil and the radio frequency coil. The radio frequency shield member includes a plurality of electrically conductive strips each extending in the direction of axis of the magnet and at least partly overlapping with respect to a neighboring conductor strip and a plurality of nonconductors sandwiched between the adjacent two conductive strips. A ring-shaped conductor having a capacitor inserted therein is disposed at each of the axial ends of the radio frequency coil along arcuated end portion of the radio frequency coil.

2 Claims, 4 Drawing Sheets

MAGNETIC RESONANCE APPARATUS

BACKGROUND OF THE INVENTION

This invention relates to a magnetic resonace apparatus and more particularly to a magnetic resonance apparatus having a radio frequency shield.

FIG. 1 illustrates, in schematic sectional side view, the conventional magnetic resonance apparatus disclosed in The Sixth Conference (August of 1987) of "Society of Magnetic Resonace in Medicine". The conventional magnetic resonance apparatus comprises a superconducting magnet 1 for generating a stationary magnetic field therein, a saddle-shaped radio frequency coil 2 disposed within the magnet 1 for transmitting radio frequency pulses and a receiving magnetic resonance signal and a magnetic field gradient coil 3 disposed between the magnet 1 and the radio frequency coil 2 for generating gradient magnetic field pulses. It is seen that a specimen 4 which is a human body in the illustrated embodiment is inserted into the radio frequency coil 2.

The conventional magnetic resonance apparatus further comprises an impedance matching circuit connected to the radio frequency coil 2, a receiving pre-amplifier 6 connected to the impedance matching circuit 5 and an input-output terminal 7 connected to the receiving pre-amplifier 6. The magnetic field gradient coil 3 has connected thereto cables 8 to which input-output terminals 9 are connected. The magnetic resonance apparatus also comprises a radio frequency shield member 10 disposed between the radio frequency coil 2 and the magnetic field gradient coil 3. The radio frequency shield member 10 is made of a single continuous electrically conductive sheet such as a copper foil having a thickness of from 35 μm to 70 μm, for example.

During the operation of the conventional magnetic resonance apparatus as described above and shown in FIG. 1, the radio frequency coil 2 which is impedance-matched by the impedance matching circuit 5 generates a radio frequency pulse signal having a frequency band of the order of from 10 MHz to 100 MHz depending upon the signal supplied from the input-output terminal 7 to provide it to the specimen 4.

On the other hand, the magnetic field gradient coil 3 applies gradient magnetic field pulses having a frequency band of the order of from 1 kHz to 10 kHz in accordance with the signal from the input-output terminals 9.

The radio frequency coil 2 then receives the nuclear magnetic frequency signal (NMR signal) from the excited specimen 4 to input through the receiving pre-amplifier 6 and the input-output terminal 7 into an unillustrated computer, wherein the signal is processed by Fourier conversion to form an image of a desired section of the specimen 4.

In order to prevent the radio frequency coil 2 and the magnetic field radient coil 3 from being magnetically coupled to each other and the sensitivity of the radio frequency coil 2 being degraded, the continuous radio frequency shield member 10 is disposed between the radio frequency coil 2 and the magnetic field gradient coil 3.

With the arrangement of the conventional magnetic resonance apparatus as above described, the magnetic coupling beteen the radio frequency coil 2 and the magnetic field gradient coil 3 is prevented by the radio frequency shield member 10 which is a single piece of an electrically conductive sheet. Therefore, an eddy current can be generated in the one-piece radio frequency shield member 10 even by the low-frequency gradient magnetic field pulse signal, causing the waveform of the magnetic field gradient pulse signal to be destorted and resulting in a degraded accuracy of the image of the section of the specimen.

SUMMARY OF THE INVENTION

Accordingly, one object of the present invention is to provide a magnetic resonance apparatus free from the above-discussed problem of the conventional magnetic resonance apparatus.

Another object of the present invention is to provide a magnetic resonance apparatus in which the accuracy of the image of the section of the specimen is improved.

Another object of the present invention is to provide a magnetic resonance apparatus in which the gradient magnetic field characteristics are improvded.

Still another object of the present invention is to provide a magnetic resonance apparatus having a magnetic shield in which only a smal eddy current is generated.

With the above objects in view, the magnetic resonance apparatus of the present invention comprises a magnet for generating a stationary magnetic field, a magnetic field gradient coil for generating gradient magnetic field pulses, and a radio frequency coil disposed within the magnet and the magnetic field gradient coil for transmitting radio frequency pulses and receiving a magnetic resonance signal. A radio frequency shield member is also disposed between the magnetic field gradient coil and the radio frequency coil. The radio frequency shield member includes a plurality of electrically conductive strips each extending in the direction of axis of the magnet and at least partly overlapping with respect to a neighbouring conductor strip and a plurality of non-conductors sandwiched between the adjacent two conductive strips. A ring-shaped conductor having a capacitor inserted therein is disposed at each of the axial ends of the radio frequency coil along arcuated end portion of the radio frequency coil. A capacitor may be connected between each of the conductor strips and said ring-shaped conductor.

BRIEF DESCRIPTION OF THE DRAWINGS

The present invention will become more readily apparent from the following detailed description of the preferred embodiment of the present invention taken in conjunction with the accompanying drawings, in which.

DESCRIPTION OF THE PREFERRED EMBODIMENT

Figure 1:
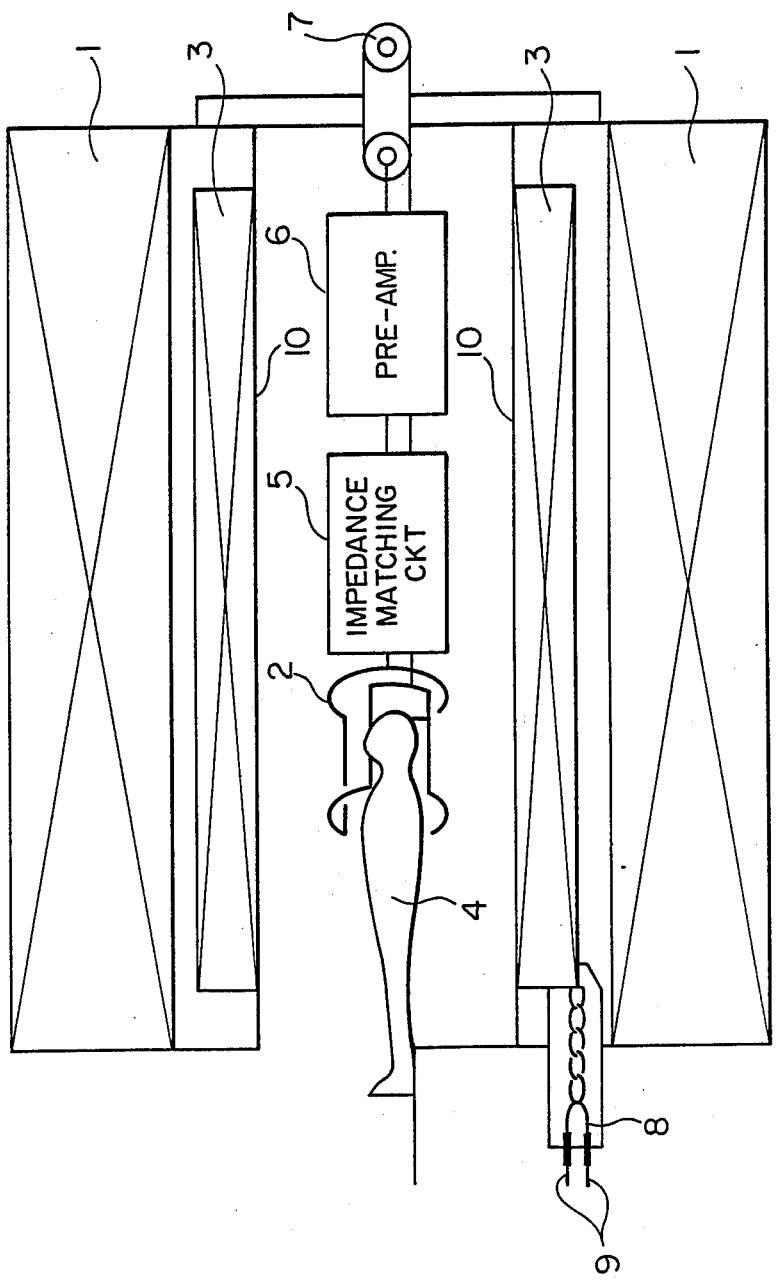
FIG. 1 is a schematic sectional side view of the conventional magnetic resonance apparatus.
Figure 2:
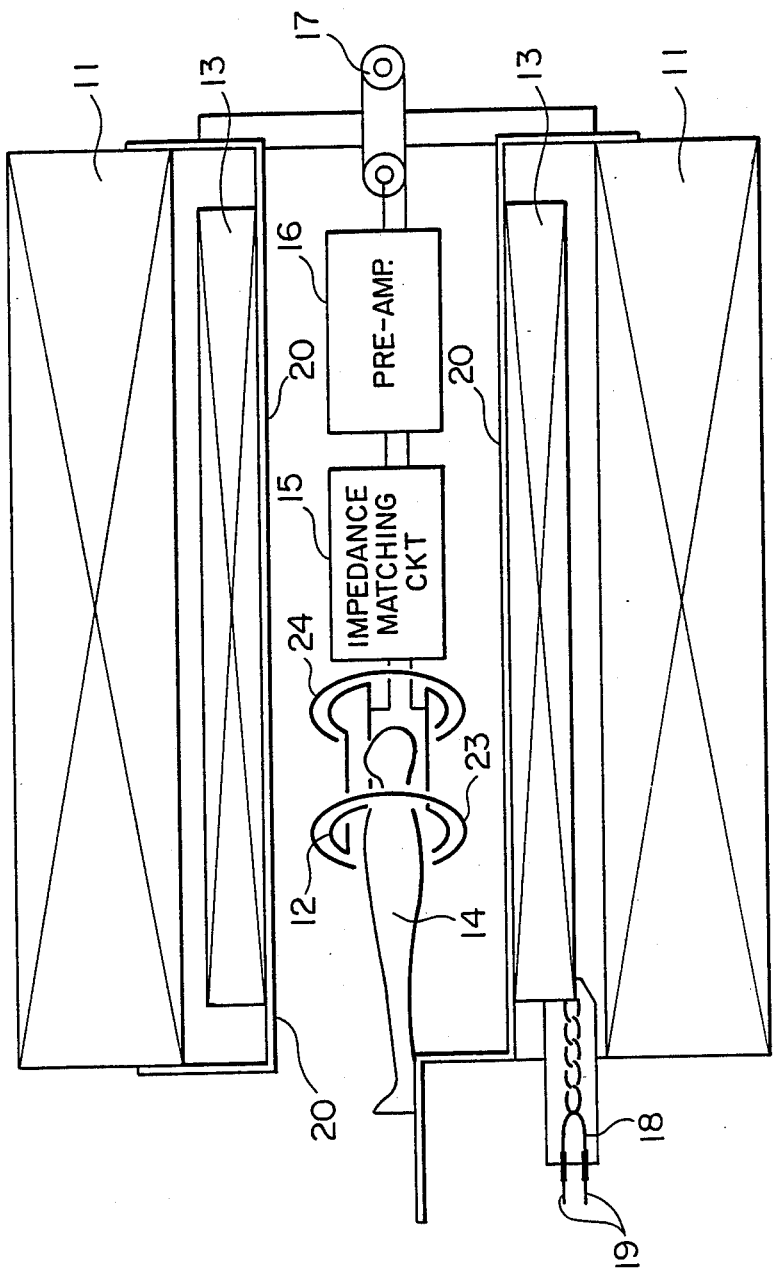
FIG. 2 is a schematic sectional side view of the magnetic resonance apparatus constructed in accordance with the present invention.

FIG. 2 illustrates, in a schematic sectional side view, a magnetic resonance apparatus constructed in accordance with the present invention. The magnetic resonance apparatus of the present invention comprises a superconducting magnet 11 for generating a stationary magnetic field therein, a saddle-shaped radio frequency coil 12 disposed within the magnet 11 for transmitting a radio frequency pulse signal and receiving magnetic resonance signal and a magnetic field gradient coil 13 disposed between the magnet 1 and the radio frequency coil 12 for generating gradient magnetic field pulses. It is seen that a specimen 14 which is a human body in the illustrated example is inserted into the radio frequency coil 12. The magnetic resonance apparatus further comprises an impedance matching circuit 15 connected to the radio frequency coil 12, a receiving pre-amplifier 16 connected to the impedance matching circuit 15 and an input-output terminal 17 connected to the receiving pre-amplifier 16. The magnetic field gradient coil 13 has connected thereto cables 18 to which input-output terminals 19 are connected.

Figure 3:
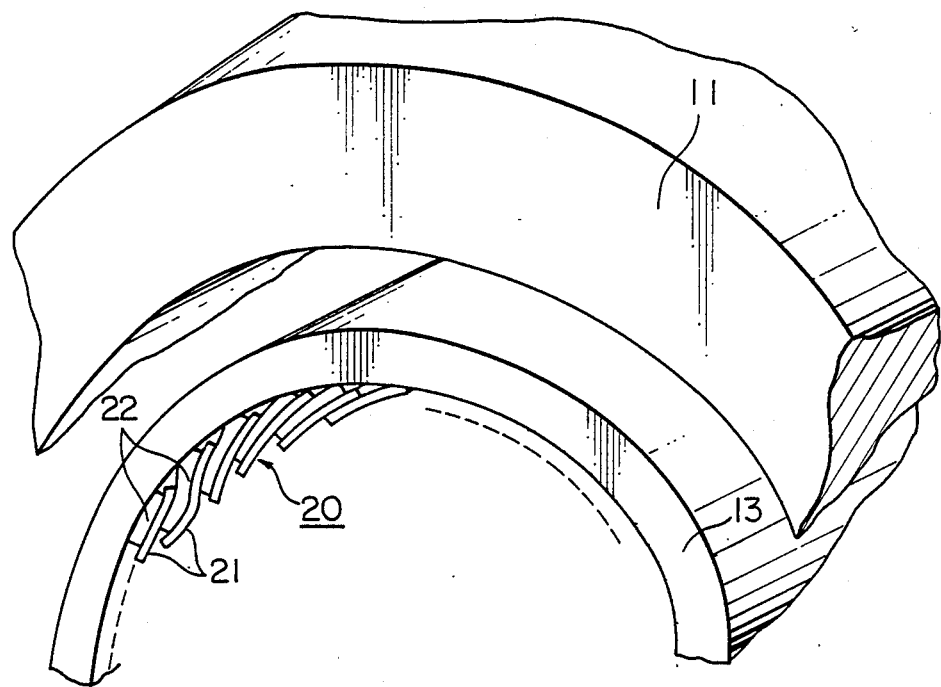
FIG. 3 is a perspective view illustrating one portion of the radio frequency shield of the magnetic resonance apparatus of the present invention.
Figure 4:
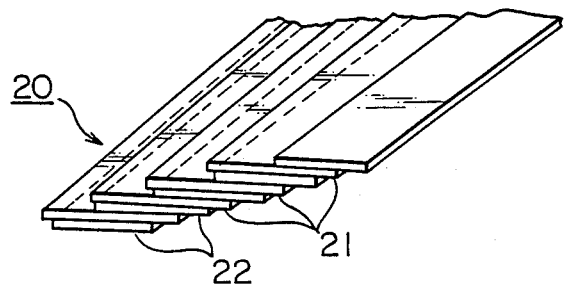
FIG. 4 is a perspective view of the radio frequency shield member shown in FIG. 3.

The magnetic resonance apparatus also comprises a radio frequency shield member 20 attached by a suitable bonding agent for example to the inner circumferential surface of the magnetic field gradient coil 13 so that it is positioned between the radio frequency coil 12 and the magnetic field gradient coil 13. The radio frequency shield member 20 of the present invention comprises a plurality of electrically conductive strips 21 each extending in the direction of axis of the magnet 23 and is arranged in an at least partly overlapping relationship with respect to an adjacent conductor strip 21 and a plurality of a non-conductor strips 22 sandwiched between the adjacent two conductive strips 21. In other words, the conductor strips 21 and the non-conductor strips 22 are alternatively placed on one another in a staggered relationship as shown in FIGS. 3 and 4. These strips 21 and 22 are bonded together by a suitable bonding agent.

The conductor strips 21 may be copper or aluminium foils having a thickness of from 18 $\mu$m to 35 $\mu$m and a width of from 40 mm to 80 mm. The non-conductor strips 22 may be Teflot (Trade name) or polyethylene sheets having a thickness of from 20 $\mu$m to 40 $\mu$m. Thicknesses of the conductor strips 21 and the non-conductor strips 22 are preferably 10 $\mu$m to 50 $\mu$m, but may be from 10 $\mu$m to 100 $\mu$m. The non-conductor strips 22 are placed on the strip conductors 21 so that they cover substantially entire major surface of each of the conductor strips 21.

The magnetic resonance apparatus of the present invention further comprises a ring-shaped conductor 23 or 24 disposed at each of the axial ends of the radio frequency coil 12. The ring-shaped conductors 23 and 24 substantially extend along arcuated end conductor sections 12a of the radio frequency coil 12 so that they substantially circle around the coil end sections 12a of the radio frequency coil 12. In the embodiment shown in FIG. 5, it is seen that each of the ring-shaped conductors 23 and 24 has a gap at the bottom portion of the ring and a capacitor 25 is inserted in the gap. The ring-shaped conductors 23 and 24 are supported from the radio frequency shield member 20 by unillustrated non-conductor so that they are held in the predetermined position.

Figure 5:
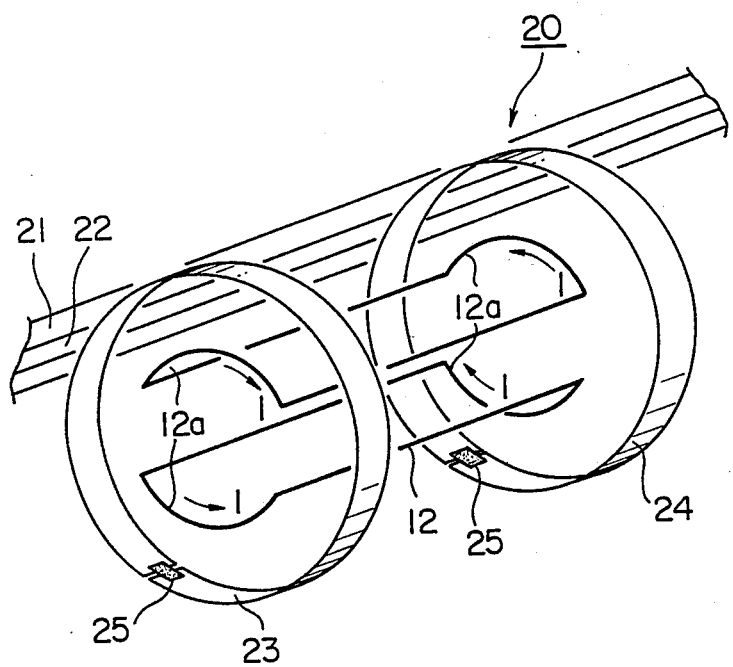
FIG. 5 is a schematic perspective view illustrating major portion of the magnetic resonance apparatus of the present invention.

These ring-shaped conductors 23 and 24 are provided in order to accomodate induction electric currents induced in the radio frequency shield member 20 due to circumferential currents I flowing through the arcuated coil sections 12a of the radio frequency coil 12 as illustrated in FIG. 5. This induction current is parcularly large when the radio frequency coil 12 is a large-sized coil for measuring the whole human body 14 and the distance between the coil end sections 12a of the radio frequency coil 12 and the radio frequency shield 20 is relatively small.

Since each of the ring-shaped conductors 23 and 24 is provided with the capacitor 25 inserted into the gap, the ring-shaped conductors 23 and 24 serve as short-circuit ring for a radio frequency pulse signal and as an open loop ring for gradient magnetic field pulses, whereby the occurance of the unnecessary short-circuit current can be prevented.

According to the experimental results, with the static capacitance of each of the capacitors 25 selected to be from 0.01 $\mu$F to 0.1 $\mu$F, the gradient magnetic field pulses can be allowed to pass through the shield without destroying the radio frequency shield effect even when the radio frequency coil 12 is very large, enabling the accurate measurement of the magnetic resonance signal transmitted from the specimen 14.

Figure 6:
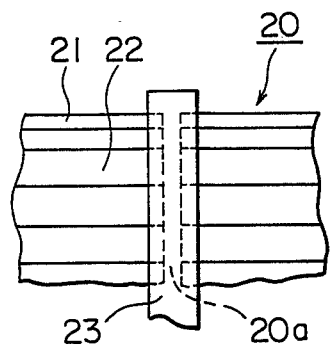
FIG. 6 is a schematic side view showing the connection portion of the ring-shaped conductors shown in FIG. 5.

As best seen in FIG. 6, the radio frequency shield member 20 composed of the conductor strips 21 and the non-conductor strips 22 arranged in a parallel, overlapping relationship to each other has a discontinuity or a clearance 20a where it overlaps the ring-shaped conductors 23 and 24. This arrangement supresses the generation of the eddy currents in response to the gradient magnetic field pulse signal of low frequency.

During the operation of the magnetic resonance apparatus as described above and shown in FIG. 2, the radio frequency coil 12 which is impedance-matched by the impedance matching circuit 15 generates a radio frequency pulse signal having a frequency band of the order of from 10 MHz to 100 MHz depending upon the signal supplied from the input-output terminal 17 to provide it to the specimen 14.

On the other hand, the magnetic field gradient coil 13 applies gradient magnetic field pulses having a frequency band of the order of from 1 kHz to 10 kHz in accordance with the signal from the input-output terminals 19.

The radio frequency coil 12 then receives the nuclear magnetic frequency signal (NMR signal) from the excited specimen 14 to input through the receiving pre-amplifier 16 and the input-output terminal 17 into an unillustrated computer, wherein the signal is processed by Fourier conversion to form an image of a desired section of the specimen 14.

With the above-described arrangement of the magnetic resonance apparatus of the present invention, the magnetic coupling between the radio frequency coil 12 and the magnetic field gradient coil 13 is prevented by the radio frequency shield member 20 which comprises the electrically conductive strips 21 each extending in the direction of the axis of the magnet 11 and is arranged in an at least partly overlapping relationship with respect to the adjacent conductor strip 21 and the non-conductor dielectric strips 22 sandwiched between the adjacent two conductive strips 21. Therefore, substantially no eddy current is generated in the stripped radio frequency shield member 20 in response to the low-frequency gradient magnetic field pulse signal such as those havign a frequency band of from 1 kHz to 10 kHz. Therefore, the waveform of the gradient magnetic field pulse signal is not destorted, allowing the accuracy of the image of the section of the specimen to be maintained at a desired level.

On the other hand, in response to radio frequency pulse signal of the order of from 10 MHz to 100 MHz, the dielectric non-conductor strips 22 sandwiched between two conductive strips 21 forms a low impedance capacitor, the radio frequency shield member 20 of the present invention functions in a similar maner to that of the conventional shield member of a single piece conductor sheet. Therefore, the radio frequency shielding is maintained, allowing the radio frequency pulse signal to be applied to the specimen 14 only within the radio frequency coil 12.

With the above-described arrangement of the magnetic resonance apparatus of the present invention, the magnetic coupling between the radio frequency coil 12 and the magnetic field gradient coil 13 is prevented by the radio frequency shield member 20 which comprises the electrically conductive strips 21 each extending in the direction of axis of the magnet 23 and is arranged in an at least partly overlapping relationship with respect to the adjacent conductor strip 21 and the non-conductor dielectric strips 22 sandwiched between the adjacent two conductive strips 21. Therefore, substantially no eddy current is generated in the stripped radio frequency shield member 20 in response to the low-frequency gradient magnetic field pulse signal such as those having a frequency band of from 1 kHz to 10 kHz. Therefore, the waveform of the gradient magnetic field pulse signal is not distorted, allowing the accuracy of the image of the section of the specimen to be maintained at a desired level.

On the other hand, in response to a radio frequency pulse signal of the order of 10 MHz to 100 MHz, the dielectric non-conductor strips 22 sandwiched between two conductive strips 21 forms a low impedance capacitive element, the radio frequency shield member 20 of the present invention functions in a similar manner to that of the conventional field member of a single piece conductor sheet. Therefore, the radio frequency shielding is maintained, allowing the radio frequency pulse signal to be applied to the specimen 14 only within the radio frequency coil 12.

Figure 7:
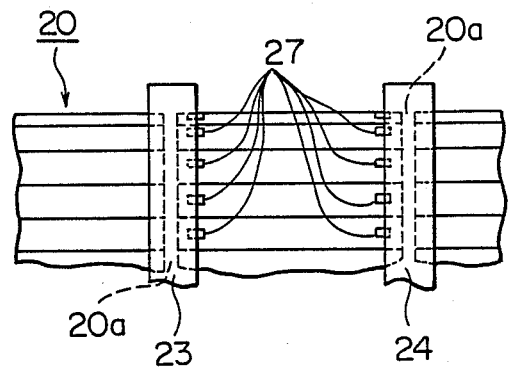
FIG. 7 is a schematic side view showing the connection portion of the ring-shaped conductors of another embodiment of the magnetic resonance apparatus of the present invention.

FIG. 7 illustrates another embodiment of the magnetic resonance apparatus of the present invention in which a capacitor 27 is inserted between each end of the strip conductors 21 of the central radio frequency shield 20 and the ring-shaped conductors 23 and 24. In this arrangement, the additional capacitors 27 are connected in seires with the capacitors formed by the non-conductive strips 22 sandwiched between the conductive strips 21 of the radio frequency shield member 20, so that the effective static capacitance between the ring-shaped conductors 23 and 24 and the conductor strips 21 of the shield 20, lowering the impedance with respect to the radio frequency pulse signal. Therefore, comparing with the arrangement in which there is no capacitors 27, this arrangement exhibits a sufficient shielding effect with respect to a radio frequency pulse signal of a relatively low frequency, expanding the applicable band of the radio frequency pulse signal.

According to experimental results, when chip capacitors having a static capacitance of the order of from 0.01 $\mu$F to 0.1 $\mu$F are used as the capacitors 27, the strip conductors 21 and the ring-shaped conductors 23 and 24 are short-circuited therebetween with respect to the radio frequency pulse signal having a frequency of about 10 MHz or more, exhibiting a satisfactory shield effect. Thus, when a radio frequency pulse signal of for example 15 MHz is used, the Q-value of the radio frequency coil 12 can be of the order of 230, whereby a Q-value similar to that of the conventional radio frequency shield member 20 made of a single copper sheet. Preferably, these capacitors 27 are disposed on the inner side of the radio frequency shield member 20 or on the side of the radio frequency coil 12 with respect to the radio frequency shield member 20 for an easy flow of the induction current.

Also, while the radio frequency coil 12 serves both for transmission and reception in the illustrated embodiments, two separate coils may be provided for transmitting a radio frequency pulse signal for for receiving a magnetic resonance signal.

As has been described, the magnetic resonance apparatus of the present invention comprises, between the magnetic field gradient coil and the radio frequency coil, a radio frequency shield member which includes a plurality of electrically conductive strips each extending in the direction of axis of the magnet and at least partly overlapping with respect to a neighbouring conductor strip and a plurality of non-conductors sandwiched between the adjacent two conductive strips, and a ring-shaped conductor having a capacitor inserted therein is disposed at each of the axial ends of the radio frequency coil along arcuated end portion of the radio frequency coil. Therefore, the generation of eddy currents in the radio frequency shield member by the radio frequency pulse signal can be substantially prevented without degrading the radio frequency shield effect, providing a sensitive magnetic resonance apparatus having improved gradient magnetic field characteristics.

What is claimed is:

1. A magnetic resonance apparatus comprising:
   a magnet for generating a stationary magnetic field;
   a magnetic field gradient coil for generating gradient magnetic field pulses;
   a radio frequency coil disposed within said magnet and said magnetic field gradient coil for transmitting radio frequency pulses and receiving a magnetic resonance signal;
   a radio frequency shield member disposed between said magnetic field gradient coil and said radio frequency coil, said radio frequency shield member including a plurality of electrically conductive strips each extending in the direction of axis of said magnet and being at least partly overlapping with respect to a neighbouring conductor strip and a plurality of non-conductors sandwiched between any two adjacent two conductive strips; and
   a ring-shaped conductor disposed at each of the axial ends of said radio frequency coil along arcuated end portions of said radio frequency coil, said ring-shaped conductor having a capacitor inserted therein.

2. A magnetic resonance apparatus as claimed in claim 1, wherein a capacitor is connected between each of said conductor strips and said ring-shaped conductor.

* * * * *